United States Patent [19]

Hays et al.

[11] 3,808,060

[45] Apr. 30, 1974

[54] METHOD OF DOPING SEMICONDUCTOR SUBSTRATES

[75] Inventors: Robert Guy Hays, Scottsdale; Ronald Charles Pennell, Mesa; Edwin Emett Reed; Charles Edward Volk, both of Scottsdale, all of Ariz.

[73] Assignee: Motorola, Inc., Franklin Park, Ill.

[22] Filed: July 5, 1972

[21] Appl. No.: 268,987

[52] U.S. Cl. .................. 148/187, 148/188, 317/235
[51] Int. Cl. .................. H01l 7/34
[58] Field of Search ............ 148/187, 188; 317/235

[56] References Cited

UNITED STATES PATENTS

| | | | |
|---|---|---|---|
| 3,575,742 | 4/1971 | Gilbert | 148/188 X |
| 3,450,961 | 6/1969 | Tsai | 317/235 |
| 3,489,622 | 1/1970 | Barson et al. | 148/187 |

*Primary Examiner*—L. Dewayne Rutledge
*Assistant Examiner*—J. M. Davis
*Attorney, Agent, or Firm*—Vincent J. Rauner; Charles R. Hoffman

[57] ABSTRACT

There is disclosed a method of controlling surface dopant concentration in a semiconductor material in which the dopant is diffused from a doped oxide source. The method involves the use of an oxidizing ambient during the doping operation which creates a growing interface oxide barrier to moderate the doping of the substrate. Control of the process is obtained by adjusting the partial pressure of the oxidant and by controlling the amount of time the semiconductor material is kept in the diffusion chamber. This process permits the use of a standard highly doped oxide coating to achieve different and controllable surface concentrations of dopants diffused from the doped oxide into the semiconductor material by controlling the rate of growth of the interface oxide barrier which results from the use of the oxidizing ambient. The method of controlling surface doping concentration may be applied to semiconductor devices including transistors and integrated circuit devices.

3 Claims, 12 Drawing Figures

INTERFACE OXIDE GROWTH FOR EQUAL TIME INTERVALS AT A GIVEN PRESSURE

TIME DEPENDENCE FOR SURFACE CONCENTRATION

PRESSURE DEPENDENCE FOR SURFACE CONCENTRATION CONTROL

METHOD OF DOPING SEMICONDUCTOR SUBSTRATES

BACKGROUND

This invention relates to the production of semiconductor devices and more particularly to methods for controlling the surface concentration of dopants diffused into a semiconductor material from a doped oxide source, and methods of producing improved semiconductor devices thereby.

In the past, doped oxide layers on top of semiconductor substrates have been utilized as doping sources for the substrates. In these processes the coated substrate is subjected to high temperatures in an inert atmosphere for a predetermined length of time. This results in the diffusion of doping atoms from the doped oxide into the semiconductor substrate. Heretofore the concentration of the dopant in the semiconductor substrate was controlled primarily by the doping concentration level in the doped oxide. Unfortunately, by this process, the surface concentration of the dopant cannot be varied except by changing the doped oxide dopant level. Controlled surface concentrations are important, not only in bipolar semiconductor devices but also in field effect transistors and in metal oxide semiconductor (MOS) devices. Accurate control of the surface concentration has been attempted by forming an interface oxide barrier, which is not initially doped, between the doped oxide and the semiconductor substrate. This interface oxide is formed as a layer on the substrate prior to the deposition of the doped oxide. It happens by controlling the initial thickness of this interface oxide barrier that the doping concentration can be reduced in a known manner by controlling the initial doping concentration in the doped oxide itself. In general, in these prior art systems, a suitably tailored doped oxide and/or a fixed thickness interface oxide barrier had to be provided for each individual case in order to obtain the required surface concentration in the semiconductor substrate. It was apparent that if each individually doped oxide layer had to be prepared separately, automation of the doping process could not easily be achieved.

It has been found that by replacing the usual inert atmosphere in the diffusion chamber with an oxidizing atmosphere that several things may occur. An interface oxide barrier is made to grow and it grows at a rate determined by the partial pressure of the particular oxidant in the ambient. The number of dopant atoms from the doped oxide reaching the semiconductor surface is altered by the growth of the interface oxide barrier. It is also thought that in some cases the oxide-silicon interface reaction rate may be altered for some dopants, increasing the mobility in silicon of the diffusing species, and thereby increasing the surface concentration. This permits the use of a single prefabricated or standard doped oxide coating to form any desired surface concentration. The desired surface concentration of the dopant in the substrate is finally dependent upon the partial pressure of the oxidant in the ambient. It is also a significant finding of this invention that neither the thickness of the doped oxide nor its doping level affects the growth of the interface oxide. This adds considerable flexibility to the doping process to be described by reducing the number of parameters which must be considered in controlling surface doping concentration. It will be appreciated therefore that the process of providing surface doping concentrations from a standard doped oxide can be automated because varying surface concentrations can be obtained from a single standard highly doped oxide layer on top of the substrate by varying the partial pressure of the oxidizing portion of the ambient. The surface concentrations thus can be accurately controlled by the control of the growth rate of the interface oxide barrier which is controlled by the partial pressure of the oxidant in the ambient.

A perhaps better understanding of the invention can be obtained by referring to the article by M. L. Barry and P. Olafsen in the *Journal of the Electrochemical Society*, Vol. 16, No. 6, at page 885, in which the following formula is derived for the surface concentration of the substrate material when doped oxides are used as diffusion sources. This formula is as follows:

$$C_2(x,t) = C_0 \sqrt{D_1/D_2}/(1+k) \operatorname{erfc} [x_B + mkx/2\sqrt{D_1 t}]$$

where $C_2$ is the surface dopant concentration, $C_0$ is the concentration in the doped oxide, $D_1$ is the diffusion coefficient of the dopant in the doped or undoped oxide, $D_2$ is the diffusion coefficient in the substrate, $k = 1/m \sqrt{D_1/D_2}$ (where $m$ is the segregation coefficient of the dopant at the substrate-oxide interface), $x_B$ is the thickness of the barrier oxide, and $t$ = time. In the above equation, no attempt is made to vary $x_B$ which is the width of the undoped oxide. It is a feature of this invention that $x_B$ is varied by the utilization of an oxidizing ambient by varying the partial pressure of the oxidant within the diffusion chamber. As mentioned hereinbefore, this results in two advantages. The first is that the doping concentration $C_0$ in the doped oxide can be kept high and constant, the final surface concentration being dependent only on the width $x_B$ as varied by the aforementioned use of the oxidizing atmosphere. The second advantage is that the growth rate of the $x_B$ term is essentially independent of the thickness and doping concentration of the doped oxide. From experimental evidence, the growth rate proceeds as if the doped oxide did not exist, for all practical purposes.

Thus, the above formula can be used to approximate the final surface doping concentration, assuming the normal growth rate of an oxide on a substrate in an oxidizing atmosphere with the doped oxide layer assumed to be infinitely thin.

However, anomalous behavior has been observed for certain dopants, especially arsenic, when the diffusion occurs in an $O_2$ atmosphere. It has been found that the surface concentration is higher for an $O_2$ atmosphere than for an inert $N_2$ atmosphere. Although the mechanism causing this phenomena is not well understood at the present time, according to the present invention it may be exploited to manufacture improved semiconductor devices.

SUMMARY OF THE INVENTION

It is therefore an object of this invention to utilize an oxidizing ambient in a doped oxide diffusion source process in which the surface concentration is a function of the partial pressure of the oxidant in the diffusion environment.

It is a further object of this invention to provide an improved method for the control of surface dopant concentration in a semiconductor substrate when doped oxides are used as diffusion sources by including in the ambient utilized in this process, a quantity of oxidant which causes an interface oxide utilized to control the doping concentration to grow at a predetermined rate, thereby controlling the surface concentration of the dopant by control of the partial pressure of the oxidant in the ambient.

It is a still further object of this invention to provide an improved method for doping a semiconductor substrate by use of a doped oxide in which the diffusion takes place in an oxidizing atmosphere.

It is yet another object of this invention to utilize the growth of an interface oxide to control the surface doping concentration of a semiconductor substrate in a process which utilizes a doped oxide with a standard doping level.

It is yet another object of this invention to provide improved methods of producing semiconductor devices using diffusions from doped oxides, wherein the diffusions are controlled by the oxidant in the diffusion environment.

Other objects of this invention will be better understood when considered in conjunction with the following drawings.

BRIEF DESCRIPTION OF THE INVENTION

There is disclosed a method of controlling surface dopant concentration in a semiconductor material in which the dopant is diffused from a doped oxide source. The method involves the use of an oxidizing ambient during the doping operation which creates a growing interface oxide barrier to moderate the doping of the substrate. Control of the process is obtained by adjusting the partial pressure of the oxidant and by controlling the amount of time the semiconductor material is kept in the diffusion chamber. This process permits the use of a standard highly doped oxide coating to achieve different and controllable surface concentrations of dopants diffused from the doped oxide into the semiconductor material by controlling the rate of growth of the interface oxide barrier which results from the use of the oxidizing ambient. Also disclosed are alternate methods of using this process to fabricate a PNP transistor having an improved base contact diffusion.

DETAILED DESCRIPTION OF THE INVENTION

As mentioned hereinbefore, in the prior art, no attempt is made at increasing the interface oxide barrier thickness when a doped oxide source is utilized with an undoped oxide barrier for the diffusion of a dopant into a substrate material. It is the primary function of the method described herein to utilize an oxidizing atmosphere such that when the substrate coated with the doped oxide layer is subjected to a heating step, either an interface oxide barrier forms and grows or an already deposited interface oxide barrier grows. The interface oxide itself operates as a moderator in that it reduces the number of doping atoms in the doped oxide reaching the substrate. If the interface oxide is sufficiently thick, no doping atoms reach the substrate. Coming back from the point at which no doping atoms reach the substrate, it has been found that by varying the thickness of the interface oxide, a varying number of atoms reach the oxide-substrate interface thus providing control over the surface doping concentration of the substrate. The thickness of the interface oxide is controlled by the partial pressure of the oxidant in the atmosphere at the exposed surface of the doped oxide. This atmosphere is any oxidizing species which causes the substrate to react to form an oxide interface. Although this invention will be described in terms of a monocrystalline silicon substrate and a silicon dioxide interface oxide, the invention is not limited to either silicon substrates or silicon oxides since the interface oxide control is the same for all oxidizable substrates. Most frequently used oxidizing atmospheres are oxygen and steam although other oxidizing atmospheres such as $N_2O$, NO and $O_3$ are clearly within the scope of this invention.

Figure 1:
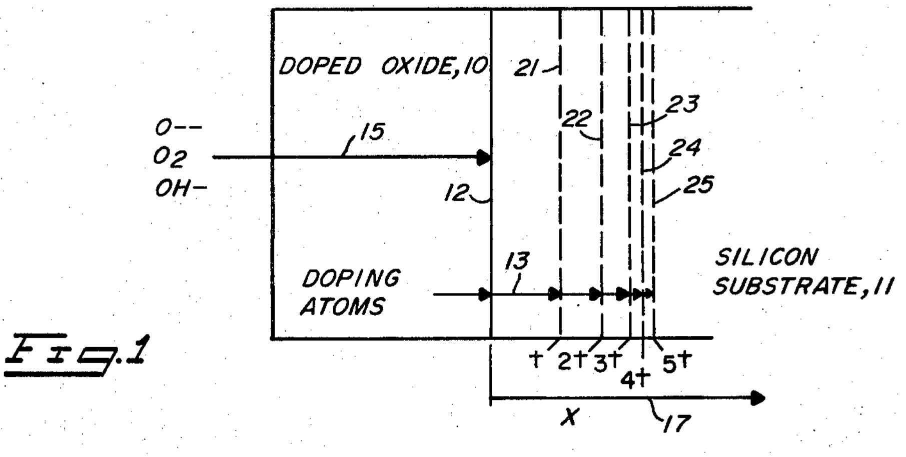
FIG. 1 is a drawing showing the growth of an interface oxide barrier during diffusion of a dopant into a silicon substrate from a doped oxide diffusion source in an oxidizing ambient.

The rate of growth of the interface oxide is determined by the partial pressure of the oxidant. If the interface oxide grows faster than the diffusion rate of the dopant through the interface oxide, no doping of the substrate occurs. On the other hand when the rate of growth of the interface oxide is less than the diffusion rate of the dopant through the interface oxide, then at least some doping atoms from the doped oxide diffuse through the interface oxide to the substrate surface. The number of doping atoms which reach the substrate surface is thus a function of the rate of interface oxide growth. This can be seen diagrammatically in FIG. 1 in which a doped oxide layer 10 is provided on a substrate 11 which in this case is made of monocrystalline silicon. The original interface between the doped oxide layer 10 and the substrate 11 is shown by the vertical line 12. If the doped oxide and the substrate are heated, there is a diffusion of the doping atoms from the doped oxide towards the right as shown by the arrows 13. If the exposed face of the doped oxide layer 10 is exposed to an oxidant in gaseous form, the oxidant diffuses so rapidly through the doped oxide (as shown by the arrow 15) it is as if the doped oxide did not exist. Thereafter, the oxidant proceeds to react with, in this case, silicon to form a silicon dioxide interface layer in the direction of the arrow 17 which defines the *x* direction and which defines the zero point as the original interface 12. At a time *t*, the oxide growth will have proceeded to the dotted line 21; at a time 2t to the dotted line 22; at a time 3t to the dotted line 23; at a time 4t to the dotted line 24 and at a time 5t to the dotted line 25. The reason for the decreasing growth with respect to the equal time intervals is that the oxide formed in the previous time interval reduces the diffusion of the oxidant to the silicon substrate 11. Thus, as more interface oxide is built up, it becomes increasingly difficult for the oxidant to penetrate to the substrate and the interface oxide growth slows down. As the new interface oxide is grown, this new oxide moderates the rate at which the dopant atoms penetrate to the silicon oxide interface. This moderation is controlled by the aforementioned growth rate of the interface oxide. Even if the growth rate of the oxide is less than the diffusion rate of the dopant in the doped oxide, it becomes more difficult for the doping atoms to penetrate the increased thickness of the oxide and thus the surface doping level of the silicon substrate is decreased from that which occurs if no new interface oxide were grown.

In general, the slowest formation of the interface oxide is accomplished with molecular oxygen. The use of steam appears to be the oxidizing agent which affords the most rapid growth of interface oxide. Depending on the dopant used to dope the doped oxide layer 10, it will be apparent that in some cases the steam stimulates such a rapid growth of the interface oxide that it exceeds the diffusion rate of the doping atoms through the interface oxide. In this case, either the partial pressure of the oxidant must be reduced so as to reduce the growth rate of the interface oxide or another oxidant must be utilized in order that at least some doping of the substrate occurs. While it is not within the scope of this invention to describe the various ways in which doped oxide may be applied to a substrate, it will be apparent that oxides doped with any of the common dopants such as arsenic, phosphorous, boron, antimony, indium, gallium, zinc, etc. may be utilized. The manner in which the control of the surface dopant concentration in the substrate is obtained is now described.

Figure 2:
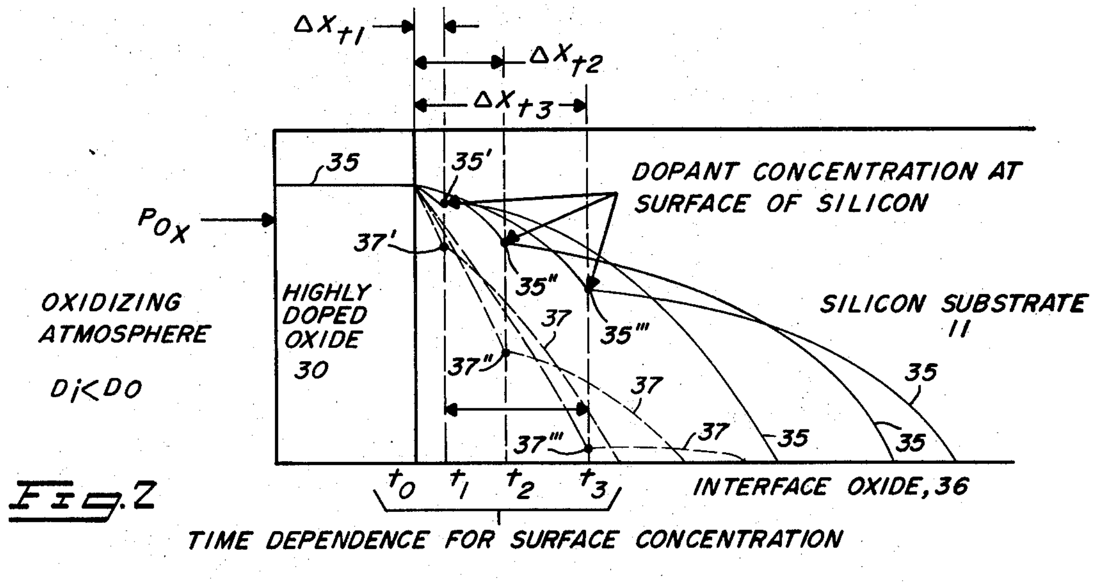
FIG. 2 is a diagram showing surface dopant concentrations and the time dependence of this concentration when the oxidizing atmosphere used in a doped oxide diffusion source process is maintained at a constant partial pressure.
Figure 3:
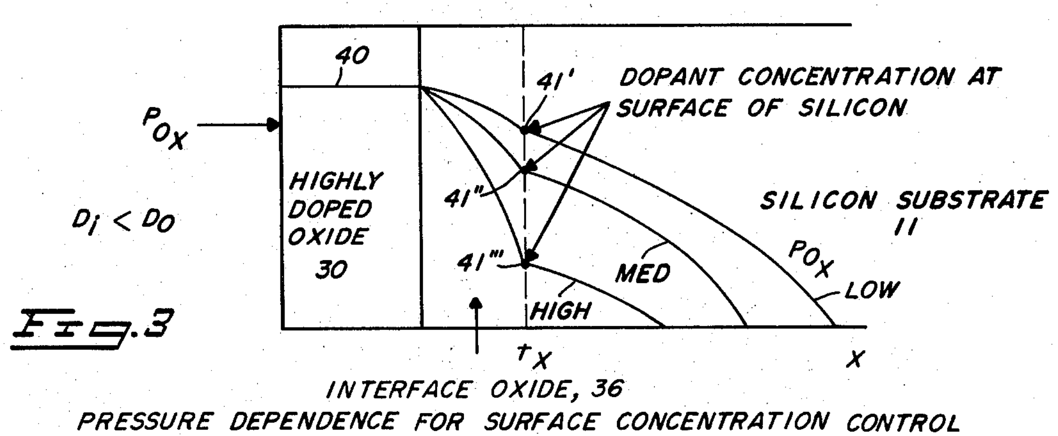
FIG. 3 is a diagram showing surface dopant concentration as a function of the partial pressure of the oxidant in the oxidizing atmosphere wherein the exposure time is constant.

It should be noted that the following graphs indicate the aforementioned growth of the interface oxide. Interface oxide growth is a function of the substrate utilized, the oxidizing atmosphere, the temperature involved and the partial pressure of the oxidant in the atmosphere. FIG. 2 shows a time dependence in which partial pressure of the oxidant is kept constant while FIG. 3 shows the pressure dependence in which the exposure time is kept constant.

Referring to FIG. 2, there is shown the time dependence of the surface concentration when a substrate 11 is provided with the highly doped oxide layer 30. Substrate 11 is most usually monocrystalline silicon. Other oxidizable substrates such as germanium are also considered within the scope of this invention when used in combination with appropriate oxidizing atmospheres. The dopant concentration both in the highly doped oxide layer and in the silicon substrate 11 is shown by the lines 35. The substrate and the doped oxide layer are both heated above that temperature at which doping atoms in the oxide start to diffuse into the silicon substrate 11. This temperature may vary from material to material. In the case of a particular silicon substrate and a phosphorus doped oxide with a constant partial pressure for the oxidant the surface doping concentration is shown by the points 35′, 35″ and 35‴, corresponding to times $t_1$, $t_2$ and $t_3$, as can be seen from this figure, the interface oxide 36 is allowed to grow. The width of this oxide is denoted respectively by the characters $\Delta X_{t_1}$, $\Delta X_{t_2}$ and $\Delta X_{t_3}$.

It will be appreciated that in this case, with a constant partial pressure for the oxidant and surface doping concentration that the surface concentrations shown at 35′, 35″ and 35‴ are decreasing with an increase in the diffusion time. This decrease in surface concentration with an increase in diffusion time is not a strong dependence, as shown in Tables I, II, and III. (From 4 minutes to 64 minutes it decreases in concentration from $2 \times 10^{19}$ to $6 \times 10^{18}$, which is a change of a factor of 3 in concentration for a factor of 16 in ratio of times; the concentration is thus a "mild" function of time).

The graph in FIG. 2 shows points 37′, 37″ and 37‴ indicating the dopant concentrations for this slower diffusing dopant under the same initial conditions and the same time intervals. The same trend is also observed for boron, (as also tabulated in Table II) because boron has a lower diffusion coefficient of dopant in silicon oxide, the concentration gradient in the oxide is much steeper, and therefore in a given distance the concentration will drop by a much greater amount, and therefore the surface concentration will be much less for boron than it is for phosphorous. As the diffusion coefficient of dopant in silicon oxide decreases, the difference in surface concentration between the doped oxide and the silicon surface concentration will be greater. The ultimate control over the surface concentration, with the partial pressure constant, is the exposure time. For a constant partial pressure, the only control over the surface concentration is the exposure time. Thus by utilizing an oxidizing atmosphere at a constant pressure, the concentration of the dopant at the surface of the silicon substrate can be controlled purely by controlling the exposure time of the substrate to both heat and the oxidizing atmosphere. It will be noted that in FIG. 2, the height of the lines 35 and 37 represent the doping concentrations in the doped oxide 30, the interface oxide 36 and the substrate 11.

The following tables are illustrative of several experimental surface concentrations as a function of time for oxides doped with phosphorus, boron and arsenic. It will be appreciated that other common dopants such as antimony, gallium and indium can also be used. In each case, the partial pressure of the oxidant was kept constant and at the level indicated.

TABLE I

SURFACE DOPING CONCENTRATION
DOPANT: PHOSPHORUS

| Temp. | Oxidant | Partial Pressure | 4 | 16 | 36 | 64(Minutes) |
|---|---|---|---|---|---|---|
| 1100°C | $O_2$ | 1 ATM | $2.0\times10^{19}$ | $1.4\times10^{19}$ | $8.0\times10^{18}$ | $6.0\times10^{18}$ |
| 1100°C | $H_2O$ | 1 ATM | $2.6\times10^{18}$ | $1.1\times10^{18}$ | $5.4\times10^{17}$ | $3.2\times10^{17}$ |

Substrate: [111] Monocrystalline silicon
Initial Substrate Doping Concentration: $10^{15}$ atoms/cm$^3$ Doping Concentration of Doped Oxide: 1.2×10[20] atoms/cm[3]

TABLE II

SURFACE DOPING CONCENTRATION
DOPANT: BORON

| Temp. | Oxidant | Partial Pressure | 4 | 16 | 36 | 64(Minutes) |
|---|---|---|---|---|---|---|
| 1100°C | $O_2$ | 1 ATM | $8.8\times10^{19}$ | $5.1\times10^{19}$ | $3.2\times10^{19}$ | $1.2\times10^{19}$ |
| 1100°C | $H_2O$ | .33 ATM | $4.7\times10^{18}$ | $2.7\times10^{18}$ | $1.7\times10^{18}$ | $0.65\times10^{18}$ |

Substrate: [111] Monocrystalline silicon

Initial Substrate Doping Concentration: $10^{15}$ atoms/cm$^3$

Doping Concentration of Doped Oxide: $3.4\times10^{20}$ atoms/cm$^3$

TABLE III

SURFACE DOPING CONCENTRATION
DOPANT: ARSENIC

| Temp. | Oxidant | Partial Pressure | 4 | 16 | 36 | 64(Minutes) |
|---|---|---|---|---|---|---|
| 1100°C | $O_2$ | 1 ATM | $1.2\times10^{20}$ | $8.5\times10^{19}$ | $5.8\times10^{19}$ | $4.7\times10^{19}$ |
| 1100°C | $H_2O$ | 1 ATM | $2.0\times10^{19}$ | $1.5\times10^{19}$ | $1.0\times10^{19}$ | $7.0\times10^{18}$ |

Substrate: [111] Monocrystalline silicon

Initial Substrate Doping Concentration: 1015 atoms/cm$^3$

Doping Concentration of Doped Oxide: $1.6\times10^{20}$ atoms/cm$^3$

Referring now to FIG. 3, the pressure dependence of the dopant concentration in the doped oxide 30, the interface oxide 36 and the substrate 11 is shown by the line 40. The points 41′, 41″ and 41‴ indicate the surface concentration of the dopant for different partial pressures. In this case, each of the curves 41′, 41″ and 41‴ are normalized to a single time $t_X$ after heat and the oxidizing ambient are applied. As can be seen, the highest doping concentration, denoted by the point 41′, is obtained with a low partial pressure for the oxidant. A medium pressure for the oxidant results in a medium surface concentration shown by the point 41″. The lowest dopant concentration is obtained for a high partial pressure as shown by the point 41‴. This is because although the diffusion rate through the oxide is to some extent heightened by an increase in ambient pressure, the increase in growth rate of the oxide occasioned by this increase in ambient pressure far exceeds the increase in diffusion rate. Thus, by increasing the partial pressure of the oxidant, the surface concentration is reduced.

In summary, it is noted that regulation of the surface concentration is accomplished by controlling the rate of growth of an undoped barrier oxide layer between the doped oxide layer and the silicon surface. The growth rate of the barrier oxide is varied by means of the partial pressure of the oxidizing species. This barrier oxide layer retards the diffusion of the diffusing dopant species into the silicon, thereby reducing the concentration of the diffusing species at the silicon surface. An important discovery of this invention which makes this control possible is that the thickness of the doped oxide does not affect the kinetics of the growth of the undoped oxide.

This is shown more clearly in the following examples in which a highly doped oxide layer 30, doped with phosphorus, boron and arsenic is subjected to step increases in the partial pressure of the oxidant.

TABLE IV

SURFACE DOPING CONCENTRATION
DOPANT: PHOSPHORUS

| Oxidant | 1 ATM | ¾ ATM | ½ ATM | ¼ ATM | 0 ATM |
|---|---|---|---|---|---|
| $O_2$ | $1.6\times10^{19}$ | $2.1\times10^{19}$ | $3.3\times10^{19}$ | $9\times10^{19}$ | $1.2\times10^{20}$ |
| $H_2O$ | $1.1\times10^{18}$ | $1.3\times10^{18}$ | $1.9\times10^{18}$ | $3.5\times10^{18}$ | $1.2\times10^{20}$ |

Time: 16 Minutes

Temperature: 1,100° C

TABLE V

SURFACE DOPING CONCENTRATION
DOPANT: BORON

| Oxidant | 1 ATM | ¾ ATM | ½ ATM | ¼ ATM | 0 ATM |
|---|---|---|---|---|---|
| $O_2$ | $8.0\times10^{19}$ | $1.0\times10^{20}$ | $1.4\times10^{20}$ | $2.1\times10^{20}$ | $3.4\times10^{20}$ |
| $H_2O$ | No Doping $D_o$ $D_i$ | No Doping $D_o$ $D_i$ | No Doping $D_o$ $D_i$ | $8.0\times10^{18}$ | $3.4\times10^{20}$ |

Time: 16 Minutes Temperature: 1100°C

TABLE VI

SURFACE DOPING CONCENTRATION
DOPANT: ARSENIC

| Oxidant | 1 ATM | ¾ ATM | ½ ATM | ¼ ATM | 0 ATM |
|---|---|---|---|---|---|
| $H_2O$ | $3.0\times10^{18}$ | $7.0\times10^{18}$ | $1.5\times10^{19}$ | $3.7\times10^{19}$ | $9.0\times10^{19}$ |

Time: 16 Minutes Temperature: 1100°C

In practice the partial pressure of the oxidant is changed by changing the relative percentages of the oxidant in a neutral carrier gas. For oxygen the neutral carrier gas can be nitrogen such that the total ambient is kept at, for instance, one atmosphere and the percentage of oxygen changed to vary the partial pressure.

As can be seen, the surface concentration can be varied either by varying the time during which the substrate is exposed to heat and the oxidizing ambient; or it can be varied by varying the partial pressure of the oxidant in the ambient. These two techniques yield an extremely automatable process such that the doped oxide layer 30 need not be changed in order to change the surface doping concentration of the substrates used. The only parameter varied is either the time or the partial pressure of the oxidant. The important factor which enables the use of a standard doped oxide for all surface doping situations is the use of an oxidant in the ambient surrounding the doped oxide. The control of either the pressure or the exposure time varies the oxide growth rate to achieve the desired surface concentration. By utilizing an oxidant containing ambient, the necessity of providing different concentrations in the doped oxides utilized in a diffusion process is eliminated.

In the case of arsenic-doped oxide diffusion sources, however, anomalous results have been observed. It has been found that diffusions from arsenic-doped oxide layers proceed at a higher rate in the presence of $O_2$ than in the presence of $N_2$ by a factor of about 5 to 10. Data illustrating this result are presented in Table VII.

TABLE VII

SURFACE DOPING CONCENTRATION
DOPANT: ARSENIC

| Temp. | Ambient Atmosphere | Partial Pressure | 30 | 45 | 120 |
|---|---|---|---|---|---|
| 1100°C | $N_2$ | 1 ATM | $7.0\times10^{19}$ | $6\times10^{19}$ | $1.5\times10^{20}$ |
| 1100°C | $O_2$ | 1 ATM | $4.5\times10^{20}$ | $4.8\times10^{20}$ | $3.7\times10^{20}$ |

Table VII includes data for surface doping concentration as a function of diffusion time for arsenic-doped oxides in the presence of pure $O_2$ and also in the presence of pure $N_2$ ambient atmospheres. It will be noted that the surface doping concentrations for the $O_2$ ambient atmosphere are higher than those for the $N_2$ ambient atmosphere. The mechanism causing this anomalous result is not well understood at the present time. It is thought that possibly for some range of partial pressures of $O_2$, some diffusing arsenic-silicate complex species $As_xSi_yO_z$ may be formed at increased reaction rates at the oxide-silicon interface, thereby causing higher surface doping concentrations for diffusions in an $O_2$ atmosphere than for those in an inert $N_2$ atmosphere. According to the present invention, this phenomena may be exploited to provide improved manufacturing processes for PNP transistors having low resistivity base contact regions.

FIG. 4 is a diagram showing the steps for making improved PNP transistors according to the present invention, by producing an enhanced base contact diffusion region by using an oxygen ambient atmosphere to enhance diffusion from an arsenic-doped oxide.

Figure 4A:
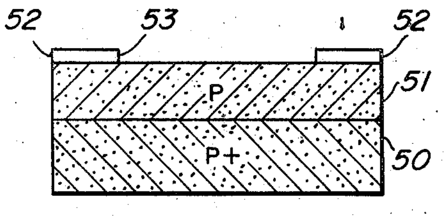
FIGS. 4*a* – 4*d* are diagrams illustrating steps for fabricating an improved PNP transistor.
Figure 4B:
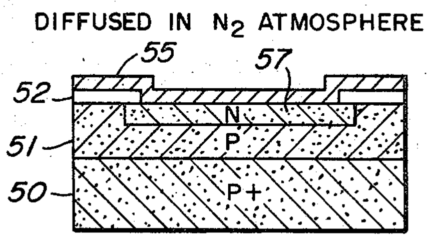
Figure 4C:
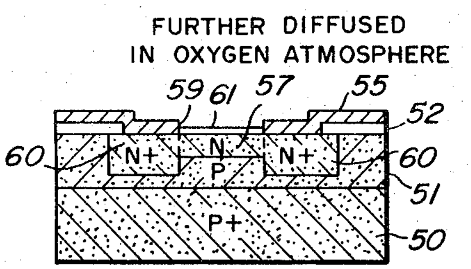
Figure 4D:
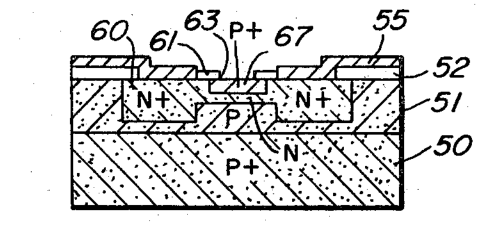
Figure 5A:
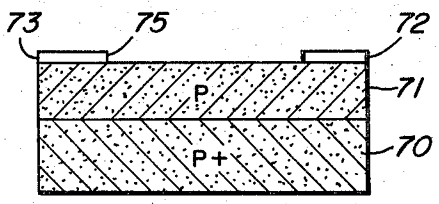
FIGS. 5*a* – 5*e* are diagrams illustrating successive steps of a general method for providing two diffused regions of different doping concentrations from the same doped oxide diffusion source in a single operation.
Figure 5B:
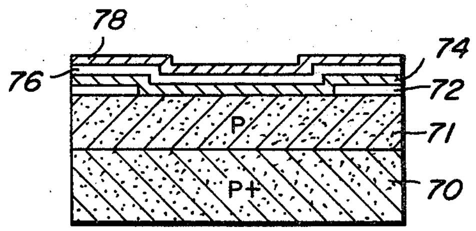
Figure 5C:
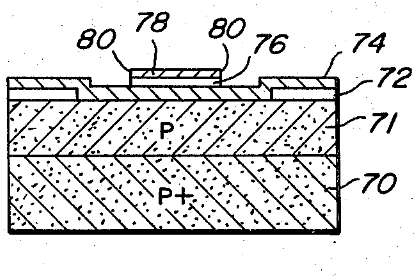
Figure 5D:
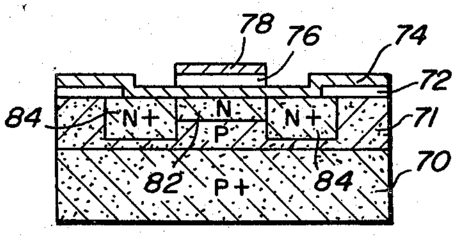
Figure 5E:
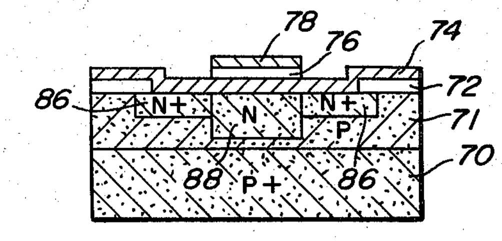

FIG. 4*a* includes a heavily doped P-type substrate 50 and an adjacent relatively lightly doped P region 51, which may be eptiaxially grown. An overlying undoped passivating oxide layer 52 is adjacent to P-type layer 51, and is patterned in such a manner that an aperture 53 in oxide 52 exposes a portion of P-type layer 51. FIG. 4*b* shows the structure after the subsequent steps of depositing an arsenic-doped oxide layer 55 over the structure and diffusing a relatively lightly doped N-type base region 57 in the presence of nitrogen ambient, the diffusion occurring from doped oxide layer 55 through aperture 53. FIG. 4*c* shows the structure after the additional steps of (1) producing aperture 59 which removes portions of arsenic-doped oxide layer 55 over the portion of the region 57 wherein relatively high resistivity is desired, and (2) continued diffusion in the presence of an oxygen ambient through aperture 53 from the remaining arsenic-doped oxide layer 55. The heavily doped N+ base contact region 60 results from this second diffusion, and a thin oxide layer 61 is simultaneously formed over the remaining lightly doped portion of base region 57. FIG. 4d shows the final structure after the additional steps of patterning apertures 63 and providing P+ emitter diffusion 67 from a diffusion source. PNP transistors fabricated according to the above-described method have more uniform device characteristics because of the simplicity of the process, which reduces the number of defect-inducing process steps and thereby increasing yields.

FIG. 5 is a diagram illustrating successive steps of a method of diffusion of two different concentrations of one dopant from the same doped oxide diffusion source in a single operation, according to the present invention. FIG. 5*a* includes a heavily doped semiconductor substrate 70 having a first conductivity type, and an adjacent relatively lightly doped region 71 also having a first conductivity type. An overlying undoped passivating oxide layer 72 is adjacent to layer 71 and is patterned in such a manner that aperture 75 in oxide layer 72 exposes a portion of layer 71. FIG. 5*b* shows this structure after several subsequent processing steps which include depositing a heavily doped oxide layer 74, having impurity doping of a second conductivity type, on oxide layer 72 and contacting layer 71 through aperture 75. A silicon nitride layer 76 is deposited on doped oxide layer 74, and subsequently an oxide layer 78 is deposited on nitride layer 76, whereby photolighographic patterning of nitride layer 76 may be accomplished. FIG. 5*c* shows the structure after several additional processing steps have been performed, including successively removing a portion of oxide layer 78 with a suitable etchant which does not attack silicon nitride, using well known photoresist techniques, and then removing a portion of silicon nitride layer 76 with a different suitable etchant which does not attack silicon dioxide. The remaining portion of oxide layer 78 thus serves as a mask for patterning silicon nitride layer 76. The patterning is accomplished so that the structure shown in FIG. 5*c* is obtained. FIG. 5*d* shows the structure after diffusion from the doped oxide layer 74 in the presence of an ambient atmosphere which enhances diffusion from the doped oxide source, providing heavily doped regions 84 adjacent and in contact with a shallower relatively lightly doped region 82, regions 84 and 82 being of the second conductivity type. It will be noted that this structure is similar to the structure shown on FIG. 4; it is apparent that this technique can be applied to fabricating a transistor having a low resistivity base contact region. FIG. 5E shows a structure which would result if diffusion from the doped oxide layer 74 occurs in the presence of an ambient atmosphere which retards (instead of enhancing) the diffusion from the doped oxide source. In this case, the lightly doped regions 86 occur where nitride layer 76 has been removed, and the deeper higher concentration region 88 simultaneously is formed by unretarded diffusion from the portion of doped oxide layer 74 immediately underlying the remaining nitride layer 76.

While the invention has been shown in connection with certain specific examples, it will be readily apparent to those skilled in the art that various changes in form and arrangement of parts may be made to suit the requirements with departing from the spirit and scope of the present invention.

We claim:

1. A method of manufacturing a transistor comprising a heavily doped semiconductor substrate region of a first conductivity type having a relatively lightly doped semiconductor region also of said first conductivity type in contact therewith, including the steps of:

a. providing a first oxide layer on and in contact with said second region, and providing said first oxide layer with an opening whereby a diffused base region may be subsequently formed within said second region;

b. depositing on said first oxide layer a relatively heavily doped second oxide layer having an impurity of a second conductivity type, said doped second oxide layer contacting said second region through said opening in said first oxide layer;

c. in the presence of a first ambient atmosphere, diffusing from said doped second oxide layer a base region of said second conductivity type into said second region, said base region being approximately coextensive with said opening in said first oxide layer;

d. removing a portion of said doped second oxide layer overlying said base region, thereby exposing an area of said base region for a subsequent emitter diffusion;

e. in the presence of a second ambient atmosphere, continuing the diffusion of said base region into a portion of said base region underlying the remaining portion of said second doped oxide layer, thereby forming a base contact region, said second ambient atmosphere causing diffusion to occur from said second doped oxide layer into said base region at a substantially greater rate than would occur if said continuing diffusion were performed in the presence of said first ambient atmosphere; and f. providing an emitter region of said first conductivity type within an opening in said second doped oxide layer.

2. The method of manufacturing a transistor of claim 1 wherein said first conductivity type is P, said second conductivity type is N, the dopant of said second oxide layer is arsenic, said semiconductor material is silicon, said first ambient atmosphere is nitrogen, and said second ambient, atmosphere is oxygen.

3. A method of manufacturing a semiconductor device comprising a heavily doped semiconductor substrate region of a first conductivity type having a relatively lightly doped second region of said first conductivity on an intimate contact therewith, including the steps of:

a. providing a first oxide layer on and in intimate contact with said second region, and providing said first oxide layer with an opening whereby base region may be subsequently formed within said second region;

b. depositing on said first oxide layer a relatively heavily doped second oxide layer having an impurity of a second conductivity type, said doped second oxide layer contacting said second region through said opening in said second oxide layer;

c. depositing a silicon nitride layer on said doped second oxide layer and in intimate contact therewith;

d. depositing a third oxide layer on and intimate contact with said silicon nitride layer;

e. etching away a first portion of said third oxide layer, exposing a portion of said silicon nitride layer directly overlying said opening and said first oxide layer, leaving a second portion of said third oxide layer intact and centrally overlying a portion of said second semiconductor region exposed by said opening and said first oxide layer;

f. etching away said exposed portion of said silicon nitride layer, exposing an underlying portion of said doped second oxide layer;

g. in the presence an ambient atmosphere, heating said substrate to a suitable temperature, whereby diffusion of doping impurities from said doped second oxide layer into said second semiconductor region occurs at one rate in the region directly underlying the portion of said doped oxide layer still protected by said portion of said silicon nitride layer and at a second rate into regions within said opening and said first oxide layer and directly underlying portions of said second doped oxide layer exposed to said ambient atmosphere, thereby providing in a single diffusion step a diffused region having two different conductivities.

* * * * *